United States Patent
Kawano

(10) Patent No.: US 8,436,468 B2
(45) Date of Patent: May 7, 2013

(54) SEMICONDUCTOR DEVICE HAVING A THROUGH ELECTRODE

(75) Inventor: Masaya Kawano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1 day.

(21) Appl. No.: 13/344,733

(22) Filed: Jan. 6, 2012

(65) Prior Publication Data

US 2012/0104560 A1    May 3, 2012

Related U.S. Application Data

(62) Division of application No. 11/167,121, filed on Jun. 28, 2005, now Pat. No. 8,115,312.

(30) Foreign Application Priority Data

Jun. 30, 2004 (JP) ................................ 2004-193177

(51) Int. Cl.
*H01L 23/48* (2006.01)

(52) U.S. Cl.
USPC ........... 257/758; 257/621; 257/684; 257/698; 257/E23.011; 257/E23.067; 257/E23.174; 438/622

(58) Field of Classification Search .................. 257/758, 257/E23.011, 621, 684, 698, E23.067, E23.174; 438/622
See application file for complete search history.

(56) References Cited

U.S. PATENT DOCUMENTS

| | | | |
|---|---|---|---|
| 4,751,562 A | 6/1988 | Yamamura | |
| 5,517,515 A | 5/1996 | Spall et al. | |
| 6,052,287 A | 4/2000 | Palmer et al. | |
| 6,376,769 B1 | 4/2002 | Chung | |
| 6,559,485 B2 | 5/2003 | Aoyama | |
| 6,611,055 B1 | 8/2003 | Hashemi | |
| 6,614,106 B2 | 9/2003 | Matsuo et al. | |
| 6,730,540 B2 * | 5/2004 | Siniaguine | 438/107 |
| 2004/0041260 A1 | 3/2004 | Wood et al. | |
| 2004/0180540 A1 | 9/2004 | Yamasaki et al. | |

FOREIGN PATENT DOCUMENTS

| | | |
|---|---|---|
| JP | 01-185943 | 7/1989 |
| JP | 05-029537 | 2/1993 |
| JP | 2002-305283 | 10/2002 |
| JP | 2003-133507 | 5/2003 |
| JP | 2007-250561 | 9/2007 |

OTHER PUBLICATIONS

Japan Patent Office Issued a Japanese Official Action dated Apr. 21, 2009, Application No. 2004-193177.

* cited by examiner

*Primary Examiner* — Kenneth Parker
*Assistant Examiner* — John Lin
(74) *Attorney, Agent, or Firm* — Young & Thompson

(57) ABSTRACT

A semiconductor device 1 has a semiconductor chip 10. The semiconductor chip 10 is constituted as having a semiconductor substrate 12 and an interlayer insulating film 14 on the semiconductor substrate 12. The semiconductor substrate 12 has a plurality of through electrodes 22 (first through electrodes) and a plurality of through electrodes 24 (second through electrodes) formed therein. On the top surface S1 (first surface) of the semiconductor chip 10, there are provided connection terminals 32 (first connection terminals) and connection terminals 34 (second connection terminals). The connection terminals 32, 34 are connected to the through electrodes 22, 24, respectively. The connection terminals 32 herein are disposed at positions overlapping the through electrodes 22 in a plan view. On the other hand, the connection terminals 34 are disposed at positions not overlapping the through electrodes 24 in a plan view.

17 Claims, 4 Drawing Sheets

PRIOR ART

PRIOR ART

SEMICONDUCTOR DEVICE HAVING A THROUGH ELECTRODE

CROSS REFERENCE TO RELATED APPLICATIONS

This application is a division of co-pending application Ser. No. 11/167,121 filed Jun. 28, 2005, which claims foreign priority to Japanese patent application 2004-193177 filed Jun. 30, 2004. The entire content of each of these applications is hereby expressly incorporated by reference

BACKGROUND OF THE INVENTION

1. Field of the Invention

The present invention relates to a semiconductor device.

2. Related Art

Typical conventional semiconductor devices can be exemplified by the one described in Japanese Patent Publication No. 3016910. The semiconductor device described in this publication has, as shown in FIG. 4 and FIG. 5, connection pads 104 formed on a circuit surface 102 of a silicon substrate 113, while placing an insulating layer 115 in between. The silicon substrate 113 also has through electrodes 105 formed therein. These connection pads 104 and through electrodes 105 are connected with each other by wiring patterns 103.

SUMMARY OF THE INVENTION

The semiconductor device shown in FIG. 4, however, has a capacitance generated during the operation between the connection pads 104 and silicon substrate 113. This inevitably demands charging/discharging of electric charge accumulated in the capacitance during signal transmission, and results in a degraded operation speed of the semiconductor device.

According to the present invention, there is provided a semiconductor device having a semiconductor chip provided with first and second through electrodes, comprising:

a first connection terminal connected to the first through electrode and disposed on a first surface of the semiconductor chip; and a second connection terminal connected to the second through electrode and disposed on the first surface of the semiconductor chip, wherein the first connection terminal is disposed at a position overlapping the first through electrode in a plan view, and the second connection terminal is disposed at a position not overlapping the second through electrode in a plan view.

In this semiconductor device, the first through electrode and first connection terminal, connected with each other, are disposed at a position allowing overlapping of the both in a plan view. For this reason, a region between these through electrode and connection terminal will have substantially no capacitance produced therein. Use of the first connection terminal as being connected to a signal line therefore allows high-speed signal processing.

The connection terminal herein can be exemplified by a connection pad, bump and so forth. The first connection terminal is, for instance, a terminal connected to a signal line as described in the above, and the second connection terminal is, for instance, a terminal connected to a power source or to the ground.

The expression of "the through electrode and the connection terminal overlap in a plan view" means that at least part of the images thereof, observed when they are projected onto a plane in parallel with the substrate surface (referred to as "projected images", hereinafter), overlap with each other.

It is also allowable that there are provided a plurality of first connection terminals and a plurality of second connection terminals, and the minimum pitch of arrangement of the second connection terminals is smaller than that of the first connection terminals. Arrangement of the first connection terminals with a relatively large pitch makes it possible to reduce the capacitance between the adjacent first connection terminals. On the other hand, arrangement of the second connection terminals with a relatively small pitch makes it possible to dispose a larger number of second connection terminals in a unit area of the first surface of the semiconductor chip. The minimum pitch of arrangement herein means a minimum value of distance between the centers of gravity of the projected images.

It is also allowable that there are provided a plurality of second connection terminals, and the minimum pitch of arrangement of the second connection terminals is smaller than that of the second through electrodes. Too small pitch of arrangement of the through electrodes may result in difficulty in forming the through electrodes. In contrast, the above-described structure makes it possible to increase the number of second connection terminals in a unit area of the first surface of the semiconductor chip without reducing the pitch of arrangement of the through electrodes.

The semiconductor chip may have a wiring disposed on the first surface side, and the second through electrode and the second connection terminal may be connected to each other by the wiring. This makes it possible to readily realize a structure in which the second through electrode and the second connection terminal do not overlap in a plan view.

The semiconductor chip may have a transistor disposed on the first surface side, and the second through electrode and the second connection terminal may be connected to each other through the transistor. It is still also allowable that the semiconductor chip has a silicon substrate, and includes no transistor circuit. Such semiconductor device is preferably used as a silicon interposer.

The semiconductor device may further comprise a third connection terminal connected to the first through electrode and disposed on a second surface, opposite to the first surface, of the semiconductor chip; and a fourth connection terminal connected to the second through electrode and disposed on the second surface. The third connection terminal in this case may be disposed at a position overlapping the first connection terminal in a plan view, and the fourth connection terminal may be disposed at a position overlapping the second connection terminal in a plan view. Because arrangement patterns of the connection terminals are designed in common both on the first surface side and the second surface side of the semiconductor chip, this case is successful in readily realizing a structure in which any other semiconductor chips or the like are stacked on the individual surfaces.

It is also allowable that there are provided a plurality of first through electrodes and a plurality of second through electrodes, and at least one of the first and second through electrodes may be arranged in a diagonal lattice pattern in a plan view. Arrangement in the diagonal lattice pattern of the through electrodes makes it possible to increase the number of through electrodes in a unit area as compared with the case of arrangement in a square lattice pattern, even under the same minimum pitch of arrangement.

The present invention therefore realizes a semiconductor device capable of high-speed operation.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
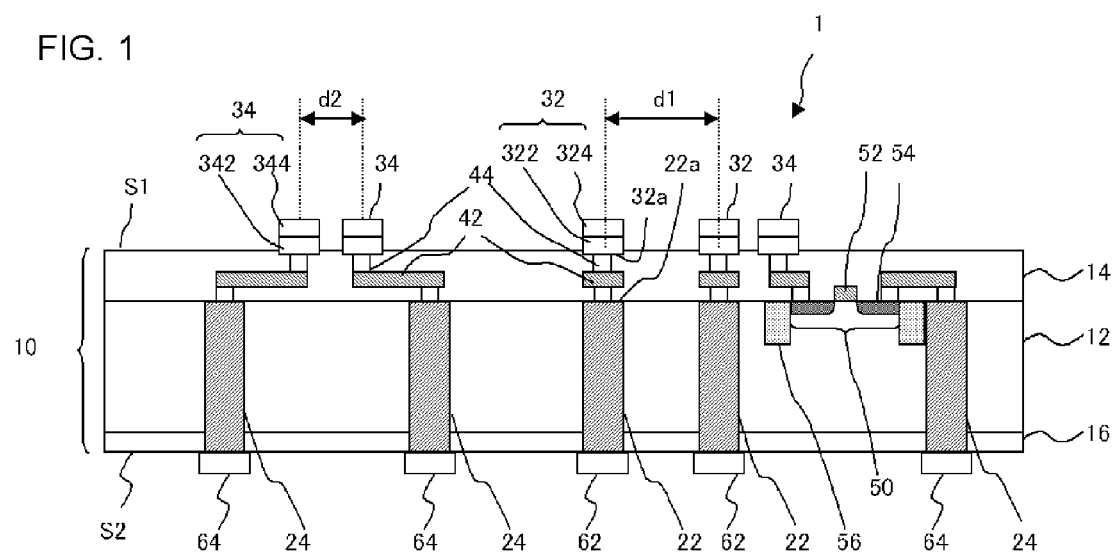
FIG. 1 is a sectional view showing a semiconductor device according to the first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will describe preferred embodiments of the semiconductor device of the present invention, referring to the attached drawings. Any identical constituents will be given with the same reference numerals, instead of omitting repetitive explanations therefor.

First Embodiment

FIG. 1 is a sectional view showing a semiconductor device according to the first embodiment of the present invention. A semiconductor device 1 has a semiconductor chip 10. The semiconductor chip 10 is constituted as having a semiconductor substrate 12 composed of single-crystal silicon, and an interlayer insulating film 14 on the semiconductor substrate 12. The surface, opposite to the interlayer insulating film 14, of the semiconductor substrate 12 is covered with an insulating film 16. The semiconductor substrate 12 has a plurality of through electrodes 22 (first through electrodes) and a plurality of through electrodes 24 (second through electrodes) formed therein.

On the top surface S1 (first surface) of the semiconductor chip 10, there are disposed connection terminals 32 (first connection terminals) and connection terminals 34 (second connection terminals). The connection terminals 32, 34 are connected to the through electrodes 22, 24, respectively. The connection is accomplished by wirings 42 and contact plugs 44 formed in the interlayer insulating film 14. Each of the connection terminals 32 is constituted by a connection pad 322 and a bump 324 formed on the connection pad 322. Similarly, each of the connection terminals 34 is constituted by a connection pad 342 and a bump 344 formed on the connection pad 342. The connection terminal 32 is, for instance, a terminal connected to a signal line, and the connection terminal 34 is, for instance, a terminal connected to a power source or to the ground.

The connection terminals 32 are arranged at positions overlapping the through electrodes 22 in a plan view. In other words, orthogonal projection of the connection terminals 32 and the through electrodes 22 onto a plane in parallel with the semiconductor substrate 12 will give overlapped projected images of the both. For any cases where the through electrode 22 does not have a uniform sectional geometry when viewed along the direction normal to the substrate surface, the projected image of the through electrode 22 is defined as the image observed by orthogonal projection of end plane 22a, on the connection terminal 32 side, of the through electrode 22. Also for any cases where the connection terminal 32 does not have a uniform sectional geometry when viewed along the direction normal to the substrate surface, the projected image of the connection terminal 32 is similarly defined as the image observed by orthogonal projection of end plane 32a, on the through electrode 22 side, of the connection terminal 32. In this embodiment, the through electrodes 22 and connection terminals 32 almost completely overlap in a plan view. In other words, the through electrodes 22 and connection terminals 32 are positionally correlated so as to make their projected images almost coincide.

On the other hand, the connection terminals 34 are arranged at positions not overlapping the through electrodes 24 in a plan view. In other words, orthogonal projection of the connection terminals 34 and the through electrodes 24 onto a plane in parallel with the substrate surface will never give overlapped projected images of the both. Definition of the projected images for the case where the through electrodes 24 and connection terminals 34 do not have uniform sectional geometries is similar to as described in the above with respect to the through electrodes 22 and connection terminals 32, respectively.

The minimum pitch of arrangement of the connection terminals 34 is smaller than the minimum pitch of arrangement of the connection terminals 32. The minimum pitch of arrangement herein means a minimum value of distance between the centers of gravity of the projected images. More specifically, the minimum pitch of arrangement of the connection terminals 32 is defined as a center-to-center distance d1 of two most adjacent connection terminals 32, and the minimum pitch of arrangement of the connection terminals 34 is defined as a center-to-center distance d2 of two most adjacent connection terminals 34. Moreover, the minimum pitch of arrangement of the connection terminals 34 is smaller than the minimum pitch of arrangement of the through electrodes 24.

The semiconductor chip 10 has a transistor 50 formed therein. The transistor 50 is constituted as having a gate electrode 52 and source/drain regions 54, and is inserted in the path connecting the through electrode 24 and connection terminal 34. Around the transistor 50, there is provided an STI (shallow trench isolation) 56 formed in the semiconductor substrate 12.

On the bottom surface S2 (second surface) of the semiconductor chip 10, there are provided bumps 62 connected to the through electrodes 22, and bumps 64 connected to the through electrodes 24. The bumps 62 and bumps 64 are directly connected to the through electrodes 22 and through electrodes 24, respectively.

Figure 2:
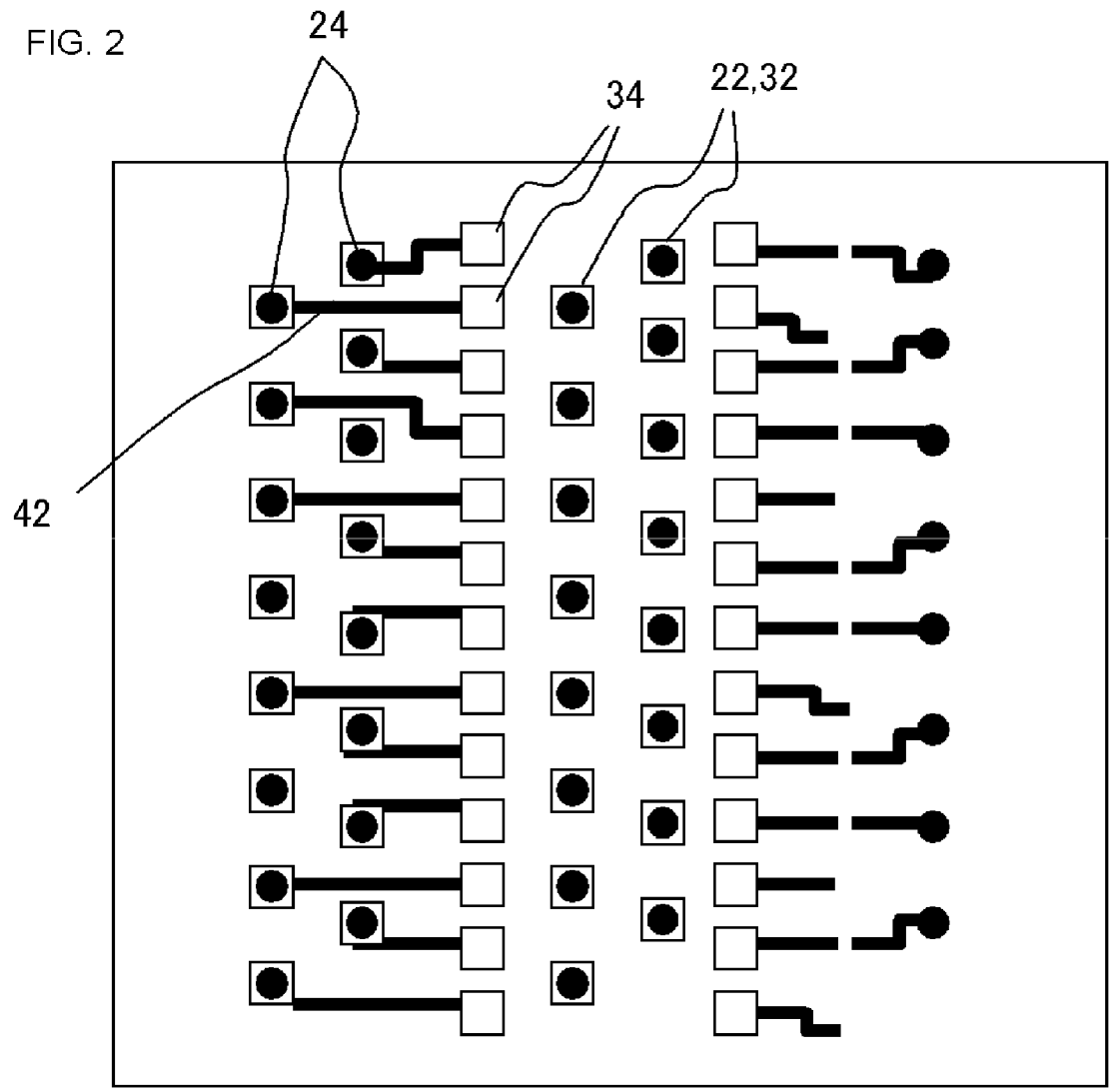
FIG. 2 is a drawing explaining an exemplary planar arrangement of through electrodes disposed on the semiconductor device shown in FIG. 1.

An exemplary planar arrangement of the above-described through electrodes 22, 24 will be explained referring to FIG. 2. As shown in this drawing, the through electrodes 22 and through electrodes 24 are arranged in the diagonal lattice patterns (or houndstooth check patterns) in a plan view.

An exemplary method of fabricating the semiconductor device 1 of the above structure will be explained. First, the through electrodes 22, 24 and STI 56 are formed in the semiconductor substrate 12, and the transistor 50 is then formed. Next, the interlayer insulating film 14 is formed on the semiconductor substrate 12, and the wirings 42 and contact plugs 44 are then formed. Next, the connection terminals 32, 34 are formed on the interlayer insulating film 14, and the bumps 62, 64 are formed on the bottom surface S2. The semiconductor device 1 shown in FIG. 1 is thus obtained. Any publicly-known methods are applicable to formation of the through electrodes 22, 24, STI 56, transistor 50, wiring 42, contact plug 44, connection terminals 32, 34 and bumps 62, 64.

Effects of the semiconductor device 1 will be described in the next. In the semiconductor device 1, the through electrodes 22 and connection terminals 32, connected to each other, are disposed at overlapped positions in a plan view. For this reason, areas placed between the through electrodes 22 and connection terminals 32 will have substantially no capacitance generated therein. This enables high-speed signal processing if the connection terminals 32 are used as being connected with signal lines. Appearance of any capacitance in the above area also results in increase in power consumption of the semiconductor device 1. From this point of view, the semiconductor device 1 is successful in reducing the power consumption.

Figure 4:
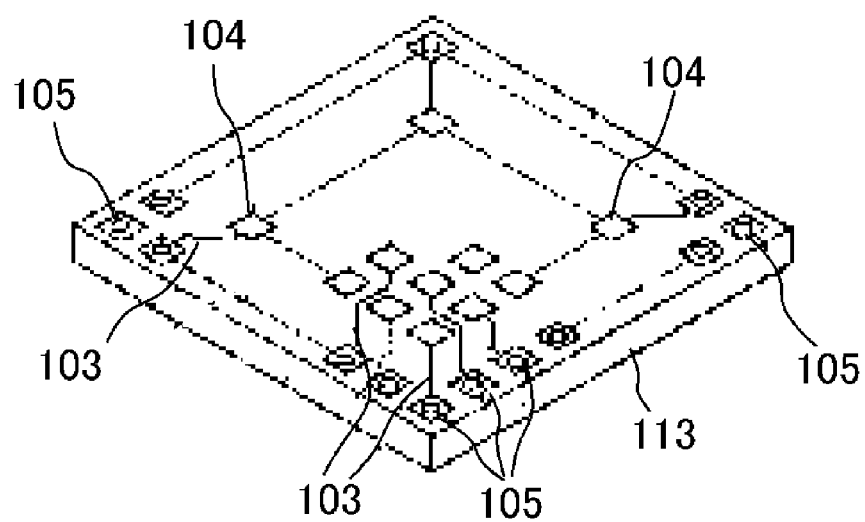
FIG. 4 is a perspective view showing a conventional semiconductor device.
Figure 5:
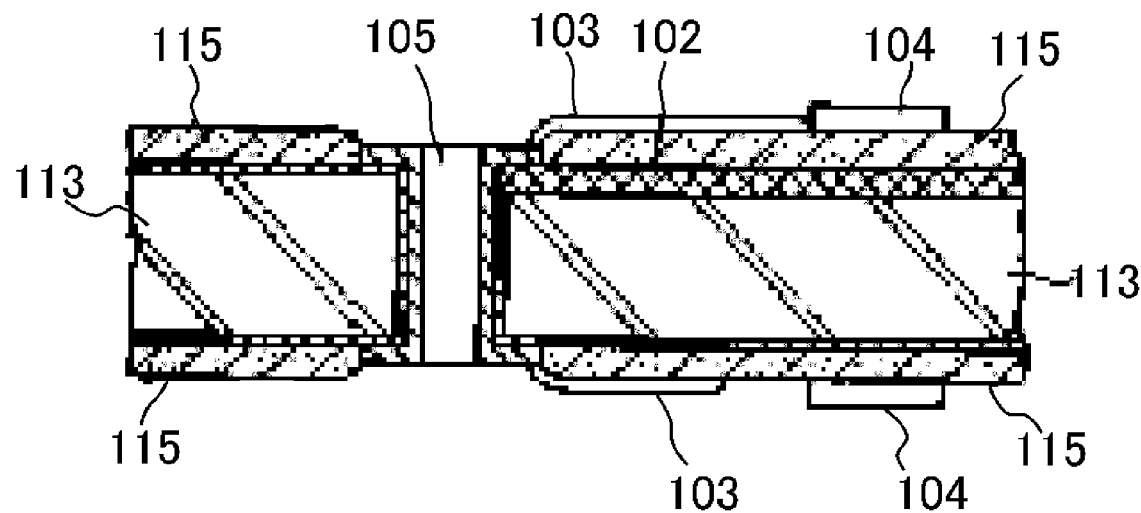
FIG. 5 is a sectional view showing the conventional semiconductor device.

Referring now back to the semiconductor device described in Japanese Patent Publication No. 3016910, the connection pads 104 are disposed at positions not overlapping the through electrodes 105. The connection pads 104 are not preferably used as being connected with signal lines, because they generate capacitance between themselves and the silicon substrate 113. This is causative of inhibition of high-speed signal processing, and of increase in the power consumption. As is obvious from FIG. 4, all connection pads 104 of the semiconductor device described in Japanese Patent Publication No. 3016910 are disposed at positions not overlapping the through electrodes 105 in a plan view, and this makes the connection pads 104 available only in connection with signal lines. The semiconductor device described in Japanese Patent Publication No. 3016910 is therefore successful in achieving neither high-speed operation nor low power consumption.

In contrast to this, the semiconductor device 1 is constituted so that a part of connection terminals (connection terminals 32) overlap the through electrodes (through electrodes 22) connected thereto in a plan view, so that selective use of such connection terminals for signal lines is successful in achieving both of high-speed operation and low power consumption.

In particular in this embodiment, the through electrodes 22 and connection terminals 32 almost completely overlap with each other in a plan view. This further enhances the above-described effects with respect to high-speed processing and low power consumption. It is not essential for the both to completely overlap with each other, but it is all enough for the both to overlap at least in a partial manner. In this embodiment, the through electrodes 22 and connection terminals 32 have an almost equal area in a plan view, but the area of the both may differ. In this case, almost complete overlapping of the through electrode 22 and connection terminal 32 in a plan view means that the projected image having relatively smaller area is completely included in that having relatively larger area.

The minimum pitch of arrangement of the connection terminals 34 is smaller than the minimum pitch of arrangement of the connection terminals 32. This means that the connection terminals 32 are arranged with a relatively large pitch, and this is successful in reducing capacitance between the adjacent connection terminals 32. This makes it possible to further improve the operation speed of the semiconductor device 1, and to further reduce the power consumption of the semiconductor device 1. Increase in the minimum pitch of arrangement of the connection terminals 32 also results in increase in the minimum pitch of arrangement of the through electrodes 22 which overlap therewith in a plan view. This facilitates formation of the through electrodes 22.

On the other hand, arrangement of the connection terminal 34 with a relatively small pitch makes it possible to dispose a larger number of connection terminals 34 in a unit area on the top surface S1. Arrangement of the connection terminals 34 with a small pitch makes it possible to increase wiring capacitance of the wirings 42 connecting the connection terminals 34 and through electrodes 24. This is successful in suppressing fluctuation of the power source or voltage drop (IR-Drop) to a low level, when the connection terminals 34 are used for the terminals connected to the power source or to the ground.

The minimum pitch of arrangement of the connection terminals 34 is smaller than the minimum pitch of arrangement of the through electrodes 24. It is to be noted herein that too small pitch of arrangement of the through electrodes 24 may sometimes make it difficult to fabricate the through electrodes 24. In contrast, the above-described structure makes it possible to increase the number of connection terminals 34 in a unit area on the top surface S1, without reducing the pitch of arrangement of the through electrode 24.

The semiconductor chip 10 has the wirings 42 disposed on the top surface S1 side, and the through electrodes 24 and connection terminals 34 are connected to each other through the wirings 42. This readily realizes a structure in which the through electrodes 24 and connection terminals 34 do not overlap in a plan view. It is, however, not essential for the through electrodes 24 and connection terminals 34 to be connected by the wirings 42.

Arrangement in the diagonal lattice pattern of the through electrodes 22, 24 in a plan view makes it possible to increase the number of through electrodes 22, 24 in a unit area as compared with the case of arrangement based on a square lattice pattern, even under the same minimum pitch of arrangement. In other words, it is made possible to more densely arrange the through electrodes 22, 24. It is to be noted herein that the patterns of arrangement of the through electrodes 22, 24 is arbitrary, allowing only either of which, or neither of which, being arranged in the diagonal lattice pattern.

Second Embodiment

Figure 3:
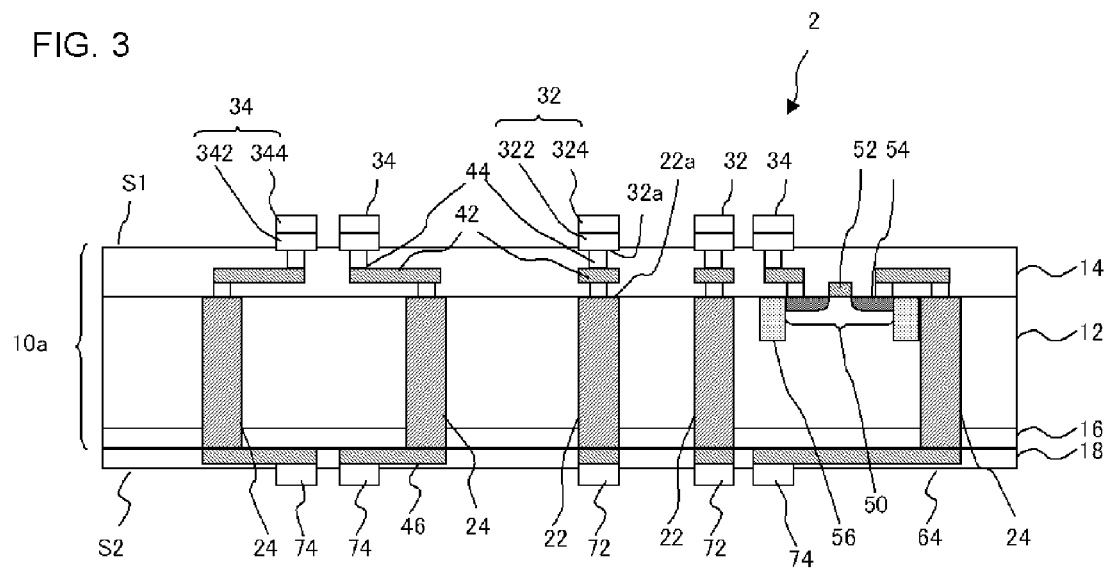
FIG. 3 is a sectional view showing a semiconductor device according to the second embodiment of the present invention.

FIG. 3 is a sectional view showing a semiconductor device according to the second embodiment of the present invention. A semiconductor device 2 has a semiconductor chip 10a. The semiconductor chip 10a is constituted as having a semiconductor substrate 12 and an interlayer insulating film 14 on the semiconductor substrate 12. The surface, opposite to the interlayer insulating film 14, of the semiconductor substrate 12 is covered with an insulating film 16. In this embodiment, there is also provided an interlayer insulating film 18 on the back surface of the semiconductor substrate 12. The semiconductor substrate 12 has a plurality of through electrodes 22 and a plurality of through electrodes 24 formed therein, similarly to the case of the semiconductor device 1. On the top surface S1 of the semiconductor chip 10a, there are disposed the connection terminals 32, 34, wherein the constitutions of the connection terminals 32, 34 being equivalent to those in the semiconductor device 1.

The semiconductor device 2 has a structure on the bottom surface S2 side of the semiconductor chip 10a different from the structure on the bottom surface S2 side of the semiconductor chip 10 of the semiconductor device 1. More specifically, on the bottom surface S2 of the semiconductor chip 10a, there are provided connection terminals 72 (third connection terminals) and connection terminals 74 (fourth connection terminals). The connection terminals 72, 74 are connected with the through electrodes 22, 24, respectively. The connection is accomplished by the wirings 46 formed in the interlayer insulating film 18. The connection terminals 72 are disposed at positions overlapping the connection terminals 32 in a plan view. Similarly, the connection terminals 74 are disposed at positions overlapping the connection terminals 34 in a plan view.

Any other constituents of the semiconductor device 2 are similar to those of the semiconductor device 1.

Effect of the semiconductor device 2 will be explained in the next. Also in the semiconductor device 2, the through electrodes 22 and connection terminals 32 connected to each other are disposed in an overlapped manner in a plan view. This successfully realizes the semiconductor device 2 capable of high-speed processing and of reducing power consumption.

The connection terminals 72, 74 are disposed at positions overlapping the connection terminals 32, 34 in a plan view. Because the arrangement patterns of the connection terminals 32, 34, 72, 74 are common both on the top surface S1 side and on the bottom surface S2 side, this is successful in readily realizing a structure in which any other semiconductor chips or the like are stacked on the individual surfaces S1, S2. The semiconductor device 2 is therefore suitable for incorporation into the stacked-type semiconductor device.

The semiconductor device of the present invention is by no means limited to the above-described embodiments, and allows various modifications. The above-described embodiments show exemplary structures in which the transistor 50 is provided to the semiconductor chips 10, 10a, but a structure in which no transistor 50 is provided to the semiconductor chips 10, 10a is also allowable. In this case, the above-described semiconductor devices 1, 2 can preferably be used as a silicon interposer. That is, the semiconductor device in the context of this patent specification means a semiconductor substrate having predetermined wirings formed thereon. Any structures having no transistor provided thereto are therefore included in the scope of the semiconductor device.

The interposer is disposed, for instance, between a logic LSI and DRAM in a stacked-type semiconductor device. In this sort of stacked-type semiconductor device, interconnection between the logic LSI and DRAM can be accomplished by the through electrodes of the interposer, and this raises effects of improving processing speed and of reducing power consumption, as compared with the case where the interconnection of the both is accomplished by wire bonding or the like.

The above-described embodiments show exemplary structures in which the connection terminals 32 are constituted by the connection pads 322 and bumps 324, but the connection terminals 32 may be constituted by only either one of the connection pads 322 and bumps 324. The same will apply also to the connection terminals 34.

It is apparent that the present invention is not limited to the above embodiments, and that may be modified and changed without departing from the scope and spirit of the invention.

What is claimed is:

1. A semiconductor device having a semiconductor chip, comprising:
   a silicon substrate provided with first and second through electrodes;
   a top first interlayer insulating film on a first surface of said substrate;
   a first connection terminal connected to said first through electrode and disposed on within a top surface of the first interlayer insulating film on said first surface,
   said first connection terminal extending into said first interlayer insulating film with a lower surface located below the top surface of the first interlayer insulating film and an upper surface extending above an uppermost surface of said first interlayer insulating film; and
   a second connection terminal connected to said second through electrode and disposed on a top surface of the first interlayer insulating film on said first surface,
   the second through electrode and the second connection terminal being connected to each other by a wiring, a length of one side of the second connection terminal being longer than a width of the wiring,
   said second connection terminal extending into said first interlayer insulating film with a lower surface located below the top surface of the first interlayer insulating film and an upper surface extending above an uppermost surface of said first interlayer insulating film,
   a first interconnect in said first interlayer insulating film connecting said first connection terminal to said first through electrode; and
   a second interconnect in said first interlayer insulating film connecting said second connection terminal to said second through electrode, wherein,
   said first connection terminal is disposed at a position overlapping said first through electrode in a plan view,
   said second connection terminal is disposed at a position not overlapping said second through electrode in the plan view, and
   said semiconductor chip includes no transistor circuit.

2. The semiconductor device according to claim 1, further comprising:
   a bottom second interlayer insulating film (16) on a second surface of said substrate, the second surface being opposite to the first surface, the first and second through electrodes extending through said second interlayer insulating film,
   wherein said first and second connection terminals are confined within an area delimited by said silicon substrate in a plan view.

3. The semiconductor device according to claim 1, wherein,
   at said first interlayer insulating film, said first through electrode is electrically connected only to said first connection terminal without being connected to any connection terminal other than said first one, and
   said second through electrode is electrically connected only to said second connection terminal without being connected to any connection terminal other than said second one, and
   wherein each of said first and second connection terminals overlaps said semiconductor substrate in the plan view.

4. The semiconductor device according to claim 3, further comprising:
   a third through electrode connected, at said first interlayer insulating film, only to a third connection terminal without being connected to any connection terminal other than said third connection terminal, said third connection terminal overlapping said third through electrode in the plan view; and
   a fourth through electrode connected, at said first interlayer insulating film, only to a fourth connection terminal without being connected to any connection terminal other than said fourth one, said fourth connection terminal not overlapping said fourth through electrode in the plan view, wherein a minimum distance between said second and fourth connection terminals is smaller than a minimum distance between said first and third connection terminals.

5. The semiconductor device according to claim 4, further comprising:
a fifth through electrode connected, at said first interlayer insulating film, only to a fifth connection terminal without being connected to any connection terminals other than said fifth connection terminal, said fifth connection terminal not overlapping said fifth through electrode in the plan view,
wherein a minimum distance between said fourth and fifth connection terminals is smaller than a minimum distance between said first and third connection terminals, and
wherein said second, fourth, and fifth connection terminals are aligned with each other in the plan view.

6. The semiconductor device according to claim 3, further comprising:
a third through electrode connected, at said first interlayer insulating film, only to a third connection terminal without being connected to any connection terminal other than said third one, said third connection terminal not overlapping said third through electrode in the plan view,
wherein the minimum distance between said second connection terminal and said third connection terminal is smaller than the minimum distance between said second through electrode and said third through electrode.

7. The semiconductor device according to claim 6, further comprising:
a fourth through electrode that is connected, at said first interlayer insulating film, only to a fourth connection terminal without being connected to any connection terminal other than said fourth connection terminal, said fourth connection terminal not overlapping said fourth through electrode in the plan view,
wherein a minimum distance between said third and fourth connection terminals is smaller than a minimum distance between said third and fourth through electrodes, and
wherein said second, third, and fourth connection terminals are aligned with each other in the plan view.

8. The semiconductor device according to claim 1, wherein said second interconnect comprises a wiring.

9. The semiconductor device according to claim 1, further comprising:
a third connection terminal, connected to said first through electrode, at a bottom surface of said semiconductor chip opposite said first surface of said substrate; and
a fourth connection terminal, connected to said second through electrode, at said bottom surface.

10. The semiconductor device according to claim 9, wherein said third connection terminal is disposed at a position overlapping said first connection terminal in the plan view, and said fourth connection terminal is disposed at a position overlapping said second connection terminals in the plan view.

11. The semiconductor device according to claim 1, wherein said first and second through electrodes are arranged in a diagonal lattice pattern in the plan view.

12. The semiconductor device according to claim 1, wherein said first connection terminal is connected to a signal line and said second connection terminal is connected to one of a power source and ground.

13. A semiconductor device having a semiconductor chip, comprising:
a silicon substrate having plural first and second through electrodes therein;
an insulating film on said semiconductor substrate;
an array of first connection terminals, each contacting said insulating film and having an upper surface extending above an uppermost surface of said insulating film and a lower surface located below the uppermost surface of said insulating film, and each connected to a respective first through electrode through a first interconnect in said insulating film; and
an array of second connection terminals, each contacting said insulating film and having an upper surface extending above the uppermost surface of said insulating film and a lower surface located below the uppermost surface of said insulating film, and each connected to a respective second through electrode through a second interconnect in said insulating film,
wherein said first connection terminals each overlaps its respective first through electrode in a plan view, and said second connection terminals each do not overlap its respective second through electrode in a plan view,
wherein each of said first and second connection terminals overlaps said semiconductor substrate in a plan view, and
said semiconductor chip includes no transistor circuit.

14. The semiconductor device according to claim 13, wherein the array of first connection terminals has a minimum repeating pitch between consecutive first connection terminals that is greater than a minimum repeating pitch in the array of second connection terminals between consecutive second connection terminals.

15. The semiconductor device according to claim 14, wherein each of said first and second connection terminals is confined within an area delimited by said semiconductor substrate in a plan view.

16. The semiconductor device according to claim 13, further comprising an additional insulating film on said semiconductor substrate at a surface opposite to the insulating film, said plural first and second through electrodes extending through said additional insulating film.

17. The semiconductor device according to claim 16, further comprising an array of third connection terminals, each contacting one of said plural first and second through electrodes at a position of said additional insulating film.

* * * * *